United States Patent [19]

Buus et al.

[11] Patent Number: 4,975,923
[45] Date of Patent: Dec. 4, 1990

[54] SEMICONDUCTOR DIODE LASER ARRAY

[75] Inventors: Jens Buus; Andrew C. Carter, both of Northampton, England

[73] Assignee: Plessey Overseas Limited, Ilford, England

[21] Appl. No.: 490,542

[22] Filed: Mar. 5, 1990

Related U.S. Application Data

[63] Continuation of Ser. No. 184,237, Apr. 21, 1988, abandoned.

[30] Foreign Application Priority Data

Apr. 21, 1987 [GB] United Kingdom ................ 8709312

[51] Int. Cl.$^5$ .............................................. H01S 3/19
[52] U.S. Cl. ....................................... 372/50; 372/96; 372/108
[58] Field of Search ...................... 372/50, 96, 108, 44, 372/45, 46

[56] References Cited

U.S. PATENT DOCUMENTS 4,719,635  1/1988  Yeh ......................................... 372/50
4,754,459  6/1988  Westbrook ............................ 372/96
4,807,245  2/1989  Hirata et al. .......................... 372/96

FOREIGN PATENT DOCUMENTS 0186083  9/1985  Japan ..................................... 372/96

Primary Examiner—James W. Davie
Attorney, Agent, or Firm—Fleit, Jacobson, Cohn, Price, Holman & Stern

[57] ABSTRACT

A semiconductor diode laser array device 1 capable of emitting a high optical power in a narrow beam, the device 1 comprising a surface emission multiridge waveguide structure in which emission can take place from a surface 4 occupying both a longitudinal and a lateral dimension of the device, the dimension in each case being much greater than the emitted light wavelength. Stability in one of said dimensions may be maintained by an array design having a spaced arrangement of laser elements positioned such that the optical field in one element partly overlaps that of a neighboring element. Preferably, the sum of the propagation constant and the coupling parameters to the neighboring elements equals the same value for all the elements in the array.

6 Claims, 4 Drawing Sheets $$k_0 = \frac{2\pi}{\lambda_0}$$

$$n = \frac{\beta}{k_0}$$

$$\lambda g = \frac{\lambda_0}{n}$$

$$K = \frac{2\pi}{\Lambda}$$

SEMICONDUCTOR DIODE LASER ARRAY

This application is a continuation of application Ser. No. 07/184,237, filed Apr. 21, 1988 now abandoned.

BACKGROUND OF THE INVENTION

1. Field of the Invention

This invention relates to a semiconductor diode laser array.

2. Description of the Related Art

The single element laser diode is an extremely attractive optical source due to the large number of advantages it offers. These advantages can include small size, rugged construction, high efficiency, direct current pumping capability and a potential for low manufacturing cost and integrability. The output power available from such a diode, however, is somewhat limited. If the output power could be improved it would enable the diode to be used in new applications where it could replace types of laser source that may lack some of these advantages.

Conventional laser diodes have active regions with a lateral width of a few microns. This ensures that the laser operates stably in a single spatial lateral optical mode. It might be possible to increase the potential optical power by having a wider active region but this usually leads to an unstable and filamentary lasing action with poor beam quality.

The resulting uneven distribution of the optical power also reduces the efficiency, and the high power capability is limited because local areas of high peak power can be present.

In attempts to increase the output power, various devices having more than one active stripe have been developed. If the distance between the array elements is large compared with the spot size for the individual elements there will be no coupling between the elements. This means that the output power will add incoherently and consequently the beam divergence will be identical to that of a single element.

To overcome these problems, the active stripes could be brought close together and phase-locked operation could be achieved. By these means, structures with a large number of active stripes have shown a power output of up to 2.6 watts and in a device with several groups of coupled stripes a power output of eleven watts has been achieved.

However, it is often observed that the beam quality of a laser array is significantly inferior to that which would be expected from a coherent addition of the individual beams. Frequently, the far field consists of two lobes. The reason for this behaviour is that in many simple array structures there is no lateral waveguiding. The waveguiding is instead induced by the charge carriers, this is often called "gain guiding". Since there is a non-linear interaction between the carrier density profile and the intensity distribution, spatial stability problems are very likely to occur. It appears now to be generally agreed that in order to achieve a single lobed diffraction limited far field it is necessary that some degree of lateral built-in waveguiding for each array element should be present. This may be achieved in a number of different ways.

It is observed that at high power even an index guided array may not have the desired single lobed far field. Instead, the array operates in a higher order mode in which adjacent array elements are 180° out of phase, which gives rise to a twin lobed far field. In order to improve the beam quality it has been suggested that improved performance may be possible if there is a sufficient optical gain between the array elements.

Another solution to the problem is to provide an array design with a high degree of uniformity as described in copending United Kingdom Patent Application Ser. No. 8628368, now published as application No. GB 2196788A, assigned to the same assignee as the present application. This discloses a laser array device having a spaced arrangement of laser elements positioned such that the optical field in one element partly overlaps that of a neighbouring element, in which the sum of the propagation constant and the coupling parameters to the neighbour elements equals the same value for all elements in the array. The propagation constant can be defined as the angular frequency of the light divided by the speed of light in the structure. The coupling parameter is a measure of the degree of overlap of the optical field in one element with that in a neighbouring element.

An alternative solution to the problem of providing a higher power output would be to use a surface emitting laser diode. Some examples of this construction use a tilted deflector or a grating to couple the optical power. In the last-mentioned construction, the emission occurs from a passive section, with the active region being placed away from the output coupling region. This implies that the output coupling occurs over a distance of the order of the coupling length of the grating, and the output power is only marginally increased by making the coupling region longer than the coupling length.

SUMMARY OF THE INVENTION

According to the present invention, there is provided a semiconductor diode laser array device capable of emitting a high optical power in a narrow beam, the device comprising a structure in which spatially coherent emission can take place from a surface occupying both a longitudinal and a lateral dimension of the device, the dimension in each case being much larger than the emitted light wavelength. Preferably, the stability in one of said dimensions is effected by an array design having a spaced arrangement of laser elements positioned such that the optical field in one element partly overlaps that of a neighbouring element. The sum of the propagation constant and the coupling parameters to the neighbouring elements may equal the same value for all the elements in the array.

An output coupling region of the device may be formed by a grating coupler. The grating coupler may carry a shadow coating.

Preferably, the device may include high reflectivity end facets. A substrate beam reflector may be provided, if required.

BRIEF DESCRIPTION OF THE DRAWINGS

By way of example, some particular embodiments of the invention will now be described with reference to the accompanying drawings, in which.

DESCRIPTION OF THE PREFERRED EMBODIMENT

Figure 1:
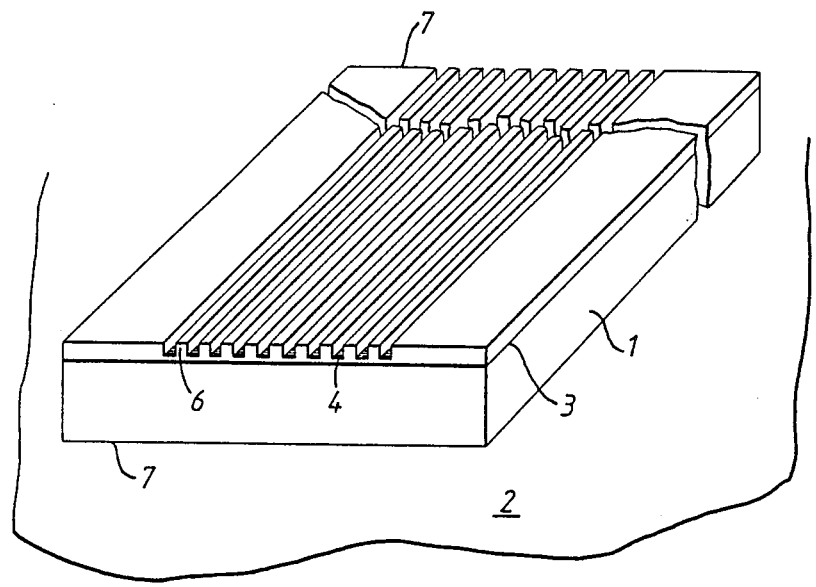
FIG. 1 is a perspective view showing the device structure.

As depicted in FIG. 1, the laser array device comprises a gallium arsenide substrate body 1 which is mounted on a heatsink 2. The body 1 carries an active region 3 and in this part a grating coupler 4 is provided. At each side of the grating coupler 4, ridge guides 6 are located.

The ends of the device 1 also include reflective facets 7.

Figure 2:
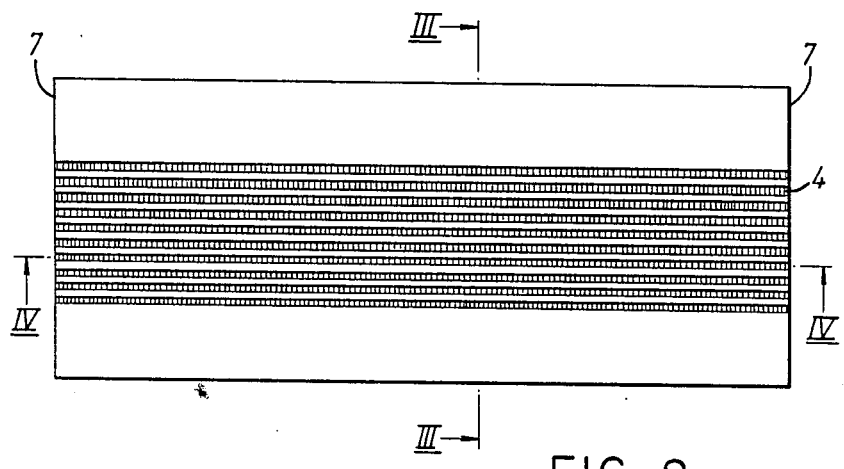
FIG. 2 is a plan view.

FIG. 2 is a plan view showing the structure of the grating coupler 4 with the reflective end facets 7. The grating coupler is a structure of parallel grooves with the bottom surface of each groove carrying a periodic structure with the period being of the same order as the optical wavelength. One example of this structure is a corrugated surface, another example would be a row of triangular prisms.

Figure 3:
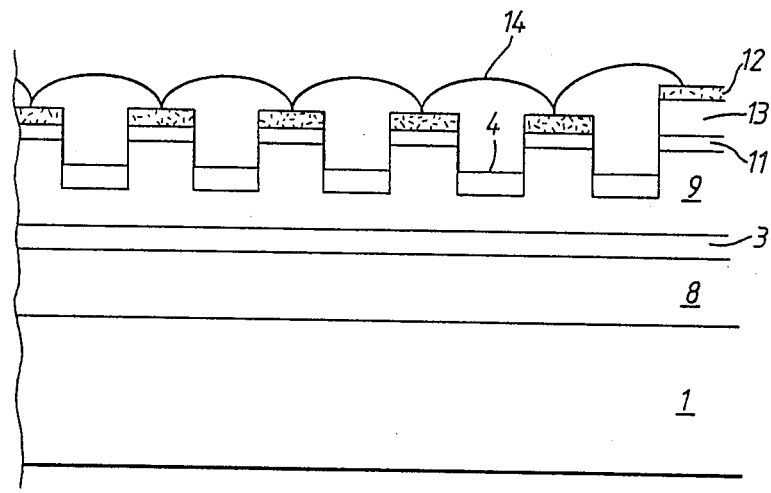
FIGS. 3 and 4 are part cross-sectional views taken respectively on the lines III—III and IV—IV of FIG. 2, FIGS. 5 and 6 give vector space diagrams for grating coupled radiation.

FIG. 3 is a cross-sectional view greatly enlarged which depicts only the right hand part of the section. The substrate body 1 can be seen to support a guide region 8 of gallium aluminium arsenide and this in turn carries the active region 3 which supports a further guide region 9 of the gallium aluminium arsenide. The outline of the grating coupler 4 has been formed in the material of the guide region 9. On top of the ridge guides 6, a further gallium arsenide layer 11 has been deposited and this is covered by a layer 12 of contact metal. At the side of the grating region, a layer 13 of electrical insulation material has been deposited prior to the deposition of the contact metal layer 12.

The ridge guide metallisation layer 12 is provided with multiple lateral electrical connections using air bridge technology. This is effected by the bridging wires 14 which connect together all the areas of contact metal forming the layer 12. There is likely in a practical construction to be several parallel arrangements of bridging wires along the length of the device. This helps to ensure uniform current distribution.

Figure 4:
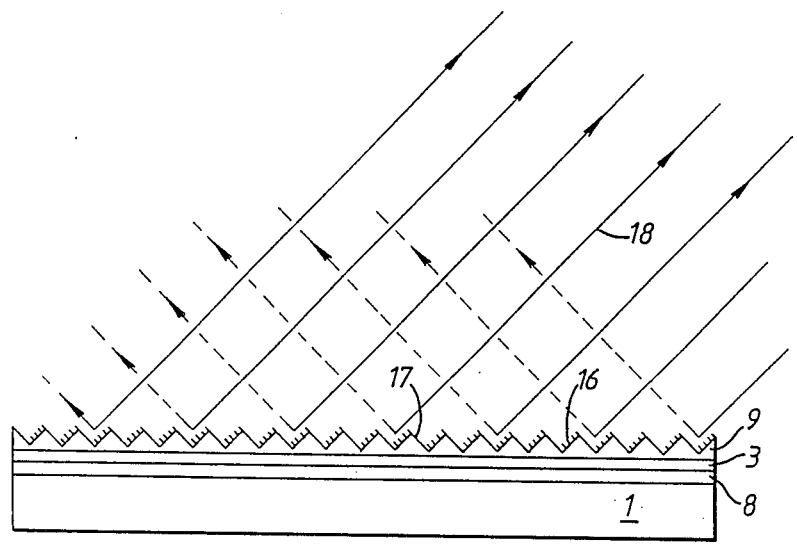

The grating out coupling is depicted in FIG. 4 which is a cross-sectional view greatly enlarged taken along the length of the bottom surface of one of the grooves of the grating coupler 4. For the sake of clarity in this Figure, the side wall of the groove structure, which would normally lie behind the corrugated bottom surface, has been omitted.

FIG. 4 show the corrugated shape of the bottom surface of the groove which is formed with alternative facets pointing generally to the left and to the right. On one set of the alternate facets, a high reflectance coating 16 has been deposited and on the other set an antireflectance coating 17. The main direction of the output radiation 18 is indicated by arrows.

The grating pitch can be selected such that only one radiating partial wave exists. This requires the pitch to be smaller than the wavelength in the material. In this case there is no significant Bragg reflection back into the lasing mode within the gain band. The coupler may be designed to match to radiation modes at, for example about 45° from the normal. The grating can be blazed and selectively coated to enhance radiation into only one of the side modes. The corresponding radiation mode into the substrate can be reflected by a semiconductor multilayer Bragg reflector below the active region in an optimised device, as will be discussed later.

A grating pitch of about 0.85 times the light wavelength in the material corresponds to about 220 nanometers which is within the possibility of construction by current grating technology. As an alternative, a larger pitch of say about 1.25 times the wavelength can be used. This larger pitch gives more flexibility in the design because it is easier to control the grating profile, but a second radiating partial wave which exists for this pitch must be suppressed.

Figure 5:
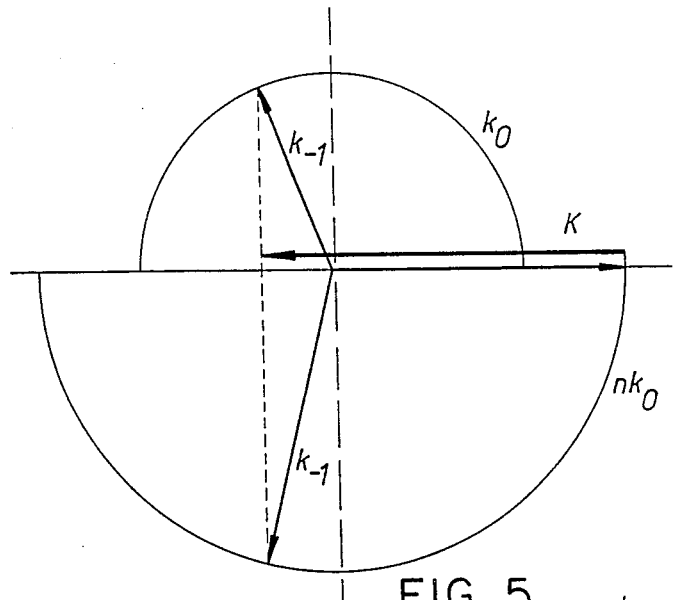
Figure 6:
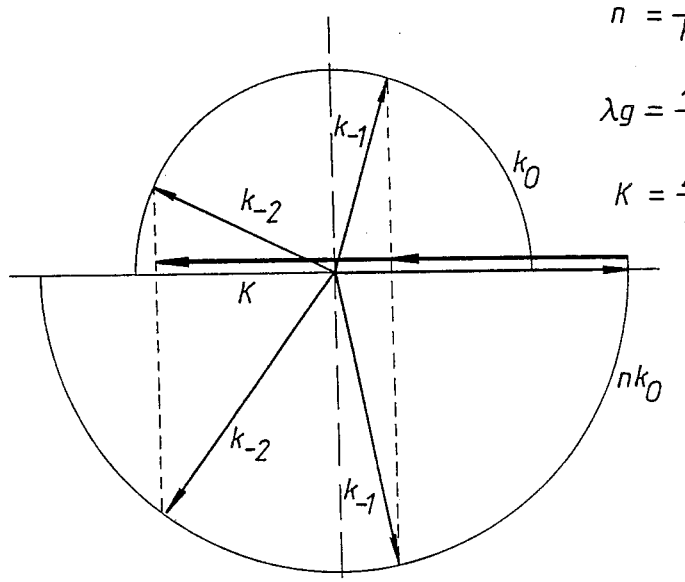

The various diffracted beams are conveniently described by vector space diagrams (see FIGS. 5 and 6) where the horizontal line shows the interface between the waveguide (below the line) and air (above the line). The different symbols shown have their usual meanings for this art. For simplicity, the diagrams show only the wave vectors corresponding to the laser mode propagating from left to right: the complete diagram is obtained by superposing the vector diagram for right to left propagation which is the mirror image of the given diagram in each case. In the FIG. 5, $\lambda_o$ is the free space wavelength, $\beta$ is the waveguide propagation constant, and $\Lambda$ the grating pitch. In FIG. 5, $|\underline{K}| \geqq |\underline{k}_o|$ and only the $-1$ diffracted orders exist. This corresponds to the case of a grating pitch $\Lambda \sim 0.85$ $\lambda g$. In FIG. 6, $|\underline{K}| \leqq |\underline{k}_o|$ and several diffracted orders exist. The case illustrated has $\Lambda \sim 1.25$ $\lambda g$, and supports both the $-1$ and $-2$ diffracted orders.

Coupling of the light into the radiated mode(s) as a function of grating and waveguide parameters is clearly critical, and requires careful design of the grating. In particular, it may be preferable to couple at a relatively low angle to the substrate, approaching the Bragg condition.

For the $\sim 0.85$ pitch and a lasing wavelength of 850 nanometers, Bragg reflection into the lasing mode occurs at about 770 nanometers and at about 1540 nanometers. The corresponding values for the $\sim 1.25$ pitch are about 700 nanometers and 1050 nanometers, respectively. These wavelengths are completely removed from the gain peak and will not influence lasing action.

The grating profile as already mentioned is amenable to shadow coating with high reflectance and antireflectance coating materials on alternate facets. Alternatively, asymmetrical blaze could be implemented using ion beam etching of the grating.

In this configuration, the grating does not provide frequency selective feedback into the laser which may therefore be expected to run in multiple longitudinal modes. Relative beam divergence between adjacent longitudinal modes will be of the same order as the diffraction limited beamwidth for the three millimetre chip aperture ($\leqq 10^{-3}$ rad).

In order to improve the efficiency of the grating coupled output high reflectively facets are preferable, in this case the device is likely to operate in several longitudinal modes.

Longitudinal mode selection could be achieved by operating the grating coupler so as to provide feedback into the lasing mode as in a Distributed Feedback (DFB)/Distributed Bragg Reflector (DBR) laser. In this case, a second order grating would be appropriate, giving feedback in second order and out coupling in first order. Possible problems arise with the residual reflectively of the facets which may prevent the device operating in the normal Bragg mode. Careful design of the grating to give the correct degree of coupling back to the lasing mode would be necessary, and this may reduce flexibility in designing the grating for efficient out coupling. A more satisfactory approach for longitudinal mode stabilisation might be to provide additional grating reflector regions at the ends of the laser stripe, providing the necessary frequency selective feedback.

Bragg reflection in a multilayer stack of III-V semiconductor materials has been demonstrated for use in surface emitting lasers (Nomura et al, J. Appl. Phys., Vol. 60, pp.874–877, 1986). Such structures have also been investigated for wavelength multiplexing/demultiplexing functions and have demonstrated intense narrow band reflections (50%, $\Delta\lambda \sim 4$ nm) using multilayer GaAs/GaAlAs stacks. In our proposed grating coupled surface emitting geometry it is inevitable that power will be coupled into the substrate as well as into the air by the grating coupler. This power could be reradiated upwards by the addition of such a multilayer Bragg reflector beneath the laser stripe. The material compositions will be chosen to be transparent at the lasing wavelength and the grating will be placed such that the two beams will be in phase, by suitable choice of the spacer layer thickness (FIG. 7).

Figure 7:
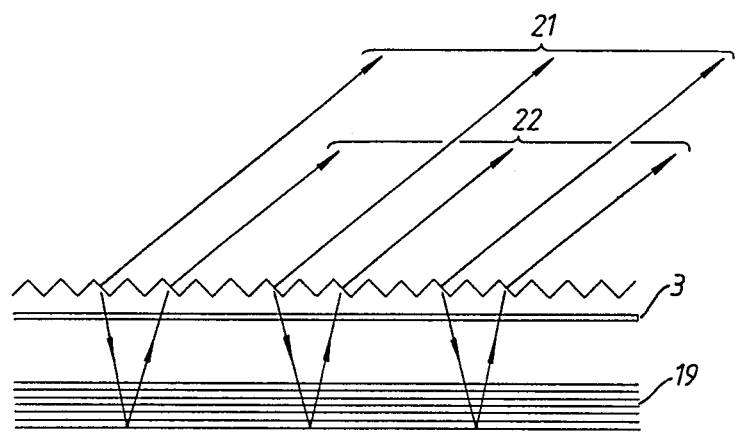
FIG. 7 illustrates the action of a Bragg reflector located beneath the laser stripe, and, FIG. 8 illustrates an embodiment of the present invention with a simple facet reflector.

In FIG. 7, the substrate is seen to include a Bragg reflector 19 which is located in the substrate beneath the active region 3. A surface beam 21 is emitted directly from the grating surface whilst a substrate beam 22 passes into the substrate, is reflected from the Bragg reflector 19 back to the surface and then is refracted parallel to the surface beam 21.

The thermal behaviour of a planar two-dimensional array is potentially excellent, with heat generated, and removed, over a relatively large emitting area (about 100 micrometers × 300 micrometers). The dominant thermal resistance in our structure will be due to the gallium arsenide substrate, as the use of substrate down bonding will be necessary for efficient light extraction. Thermal resistance will be minimised by substrate thinning and bonding the devices onto suitable high conductivity heat sinks.

The devices must be designed to withstand the high electrical drive currents necessary for high continuous working array power. This poses particular desing requirements on the upperside metallisation, which must give uniform pumping along the chip to preserve beam quality. We expect to make multiple lateral connections to the ridge guide metallisation, using either dielectric isolation or air bridge technology. These technologies are standard in power Field Effect Transistor and Millimetre Wave Integrated Circuits (MMIC) processes and can be readily extended to the proposed laser. The aperturing affect of the cross connections will be minimised consistent with the current requirements. The problem will be further reduced by the use of thick, high conductivity metallisation. This technique has been demonstrated on ridge waveguides for traveling wave gallium arsenide/gallium aluminium arsenide optical modulators.

High reliability will be ensured in the device by substrate selection (low defect density), high quality material growth (MOCVD), optical and electrical design (minimisation of power and current densities to reduce facet degradation and metal migration) and low stress bonding (junction up). The highly reflecting conventional facets will reduce the peak power density below that in a conventional one-dimensional array. Power density in the two-dimensional coherent output beam will be less than 10 kW/cm$^2$, this value being several orders below likely damage thresholds. Suitable screening tests will be facilitated by the structure construction, as defects in the active region will be likely to be observable from the emitting surface.

It is expected that the construction of the present invention will result in laser diode arrays with the following performance.

| | |
|---|---|
| Wavelength | about 850 nanometers |
| Device active area | 100 × 3000 micrometers |
| Equivalent elements | 10 × 10 |
| Threshold current | 2A |
| Efficiency, differential | 30% minimum, increasing with enhancements discussed |
| Maximum phased locked power, for continuous working | about 3 watts at 10A (increasing with efficiency enhancements) |
| Max phased locked power, for pulsed working | 20 watts at 60A (increasing with efficiency enhancements) |
| Array filling factor | about 0.5 (defined as P average/$P_{max}$) |
| Output spectrum | Multilongitudinal, about 0.3 nanameter mode spacing |
| Far field, lateral | 1° single lobed output beam |
| Far field, longitudinal | 0.1° single lobed output beam |

It is belived that an ultimate efficiency of over 50% is possible, with a corresponding increase in both continuous working and pulsed power operation.

Figure 8:
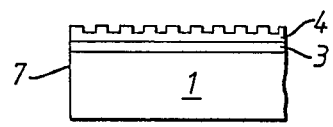
Figure 9:
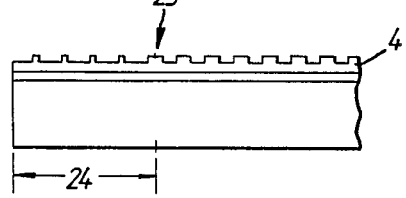
FIG. 9 illustrates an embodiment of the present invention with a grating reflector.

In a different embodiment, the out coupling and end reflection may be achieved by using a grating acting both as coupler and reflector. In particular, this can be achieved by having the same grating period both for the coupler and the reflector, but different grating shapes. For example, the grating in the output coupling region would give efficient output coupling (−1 refracted order) but low coupling to the contrapropagating beam (−2 refracted order), the reflector should couple effectively to the −2 refracted order and weakly to the −1 refracted order, see FIG. 8 and FIG. 9. The grating reflector will provide longitudinal mode selection. FIG. 8 shows in part a longitudinal cross-section as depicted in FIG. 4. FIG. 9 shows the alternative structure where a change in the grating shape has been carried out at the point 23 which causes the end portion of the grating 4 to act as a reflector 24. The reflector 24 portion thus has a different shape for the grating ridges but it still has the same grating period. This then acts as a wavelength selective mirror so that the provision of an end facet of high reflectivity on the end of the device is no longer necessary.

The foregoing description of embodiments of the invention has been given by way of example only and a number of modifications may be made without departing from the scope of the invention as defined in the appended claims. For instance, the lateral ridge structure may be based on a Y coupler configuration, or some ridge design different from that described in the aforementioned patent application. The important point is to ensure that lateral mode stability is achieved.

Alternative material can be used, in particular GaInAsP compounds using InP as substrate material. This has the advantage that the substrate is transparent at the lasing wavelength, thus allowing the device to be mounted with the active region positioned close to the heatsink, thereby improving the thermal properties.

We claim:

1. A distributed feedback type semiconductor laser device of the kind including a narrow stripe-shaped distributed-feedback mechanism arranged on an active layer, the device comprising, a substrate support body;
   an active region carrying a longitudinal groove which is formed therein, said groove having a bottom surface which is shaped as a periodic structure with the period being of the same order as the optical wavelength to be generated, said bottom surface thus constituting a narrow stripe of a distributed-feedback mechanism, and side walls of said groove forming ridge guides for said mechanism, said groove having additional similar grooves located alongside in a parallel arrangement to form a two-dimensional radiation area,
   the spacings between the said grooves being arranged such that a spatially coherent light emission can take place from the whole area of the groove arrangement.

2. A laser device according to claim 1, in which the configuration of the distributed-feedback means and side walls constitutes a diffraction grating.

3. A laser device according to claim 1, in which the neighboring laser elements are arranged such that the sums of the propagation constant and the coupling parameters are equal to the same value for all the elements of the array.

4. A laser device according to claim 2, in which said diffraction grating is constituted by a saw-tooth configuration having ridges raised relative to said bottom surface.

5. A laser device according to claim 1, in which the active region is formed of gallium aluminum arsenide.

6. A laser device according to claim 2, in which said diffraction grating is arranged to have a grating pitch which is between 0.85 and 1.25 times the wavelength of light in the material.

* * * * *